April 25, 1967 N. H. KLOS 3,316,457

ASSEMBLY FOR PACKAGING ELECTRONIC COMPONENTS

Filed Oct. 23, 1965 2 Sheets-Sheet 1

INVENTOR.
NICOLAAS H. KLOS,
BY
Walter R. Thiel
ATTORNEY.

April 25, 1967 N. H. KLOS 3,316,457

ASSEMBLY FOR PACKAGING ELECTRONIC COMPONENTS

Filed Oct. 23, 1965 2 Sheets-Sheet 2

INVENTOR.
NICOLAAS H. KLOS,
BY
Walter R. Thiel
ATTORNEY.

United States Patent Office 3,316,457

Patented Apr. 25, 1967

3,316,457

ASSEMBLY FOR PACKAGING ELECTRONIC COMPONENTS

Nicolaas H. Klos, Oceanside, Calif., assignor to Hughes Aircraft Company, Culver City, Calif., a corporation of Delaware Filed Oct. 23, 1965, Ser. No. 504,029
3 Claims. (Cl. 317—100)

Figure 1:
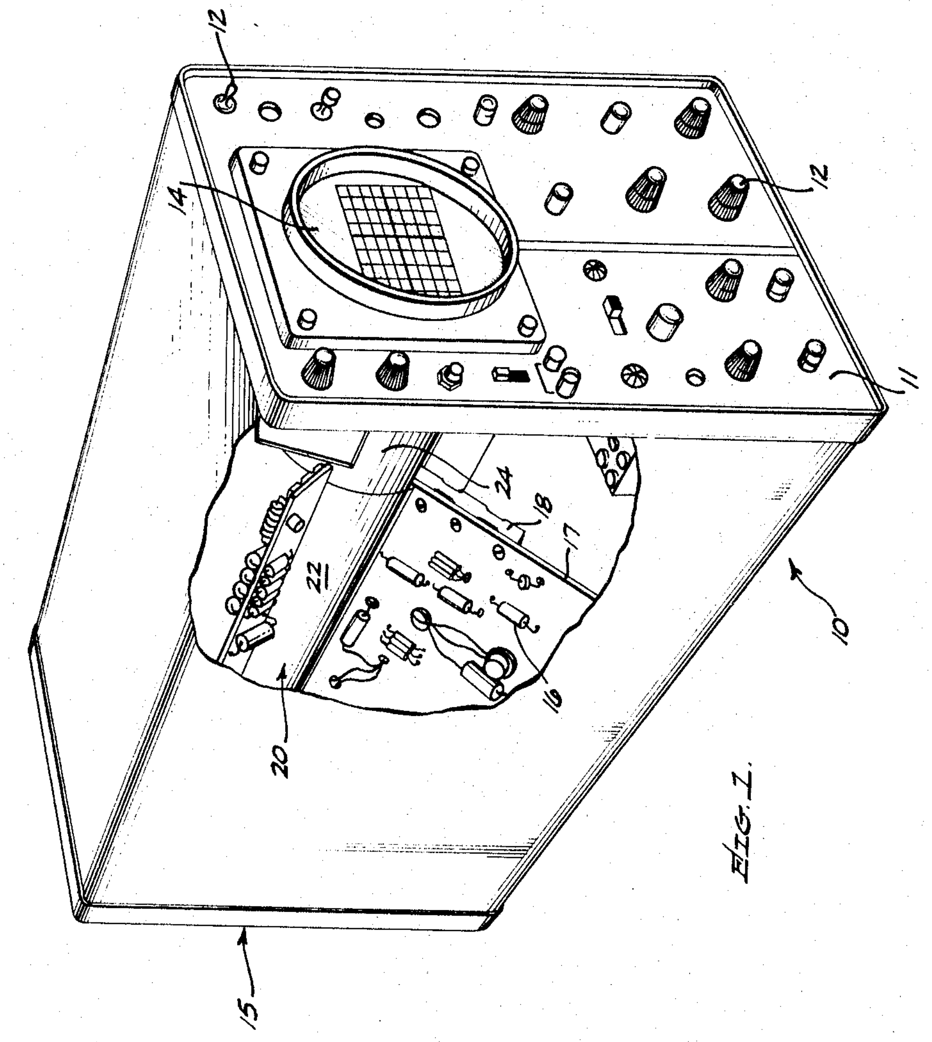

The present invention relates generally to a packaging assembly for electronic components and more particularly to an assembly for such components wherein they are packaged in a radial fashion about a support member rather than in vertical or horizontal layers or chassis.

As the complexity of electrical instruments increases through the incorporation of additional components necessitated by the introduction into an instrument of new operations, a need has arisen to assemble such components in a logical space saving, easily serviceable fashion. Heretofore, the practice of assembling electronic components has been to mount them within a housing or enclosure in vertical or horizontal layers such as the plurality of horizontal chassis used to support the electronic components of a standard electronic oscilloscope. Such assembly techniques were satisfactory as long as the instruments were not too complicated, however, with the introduction of additional electronic components a new method of assembly was found desirable.

Therefore, an object of the present invention is to provide an improved assembly for packaging in a logical and efficient manner the components of an electrical or a mechanical instrument.

Another object of the present invention is to provide an improved packaging assembly wherein the components are affixed to boards which radiate from a central support member.

A further object of the present invention is to provide an improved packaging assembly for electronic components wherein the components are mounted in a fashion enabling a more even circulation of cooling air about each component.

A still further object of the present invention is to provide an improved packaging assembly for electronic components wherein each component is readily accessible for repair or removal.

Briefly, the preferred embodiment of the present invention includes a pair of end plates to which is attached an elongated support member. The support member is of such a construction that a plurality of pairs of brackets may be attached thereto, these pairs being attached at predetermined locations on the periphery of the support member and are shaped to receive, in a radial fashion, a mounting member for electronic components such as a printed circuit board.

Figure 3:
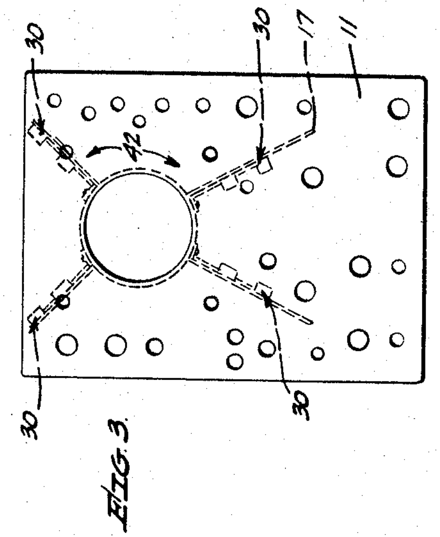
Figure 2:
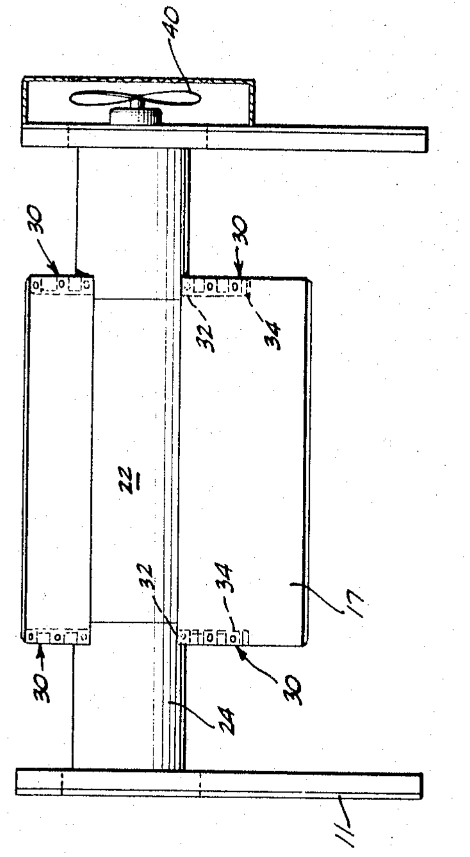

These and other objects and advantages of this invention will become apparent from the following description taken in accordance with the specification and considered in conjunction with the accompanying drawings throughout which like reference characters indicate like parts and in which:

FIGURE 1 is a perspective view of one embodiment of the present invention as it is applied to a typical electronic oscilloscope having a portion cut away to show the electronic components thereof mounted to circuit boards which are supported radially from a central structural support member;

FIG. 2 is a side elevational view of the preferred embodiment of the present invention of FIG. 1 shown in schematic form to illustrate more completely the radial support of the circuit boards and including a cooling fan affixed to one of the end plates; and FIG. 3 is a front view of the schematic representation of the present invention shown in FIG. 2 illustrating more clearly the radial positioning of the circuit boards around the periphery of a central support member.

Referring now to FIG. 1, one application of the present invention is the packaging or assembling of electronic components for an electronic oscilloscope, and it is this embodiment which is illustrated in the figures and described hereafter. However, it should be understood that the teaching and application of this novel packaging assembly is not restricted to electronic oscilloscopes but may be used in the packaging of components for other mechanical or electrical devices or instruments.

Typically, an oscilloscope 10 includes a front plate 11 to which are attached a plurality of control and operation devices 12 such as switches or control knobs for electrical potentiometers and the viewing screen and graticule of a cathode ray tube 14. The cathode ray tube 14 is elongated in shape and terminates at an end plate 15 having a shape similar to the front plate 11. The length of the cathode ray tube 14 generally dictating the longest dimension of the package or enclosure. Electrically or mechanically coupled to each of the control or operation switches or devices 12 are a plurality of electrical components 16 formed into electrical circuits such as, for example, the X and Y deflection circuits. The electrical components 16 are mounted to circuit boards 17 and are interconnected by a plurality of electrical conductors in a prearranged fashion such that each board may contain one or more electrical circuits of the oscilloscope. Each of the circuit boards 17 is retained by a pair of support members 18 which are radially affixed to an elongated structural member 20. Thus the circuit boards 17 may be easily assembled or if desired disassembled from the oscilloscope.

In the presently preferred embodiment it has been found desirable to encase or enclose the cathode ray tube 14 in an electrical shield member 22 which is rigidly affixed to each of the end plates 11, 15 by supporting it in intermediate support rings 24 which are affixed to the end plates at a point substantially coaxial with the longitudinal central axis of the oscilloscope. While in this embodiment, the shield 22 and the support rings 24 form the elongated structural member 20, this invention is not so limited since the elongated structural member 20 can be any rigid member of a length at least equal to that of the shortest circuit boards 17.

Referring now to FIGS. 2 and 3, one method of affixing the circuit boards 17 to the elongated structural member 20 is by a plurality of pairs of brackets 30 which perform a function similar to that of the support members 18 shown in FIGURE 1. Each pair of brackets 30 is attached to opposite support rings 24 and is aligned with an axis parallel to the central axis of the instrument. Each of the brackets 30 includes a flange 32 having a threaded bore for attachment by a conventional method such as a screw to the support ring 24 and a plurality of fingers 34 each of which contains a threaded bore for attaching the circuit board 17 to the bracket 30 by a conventional means such as a screw.

As shown schematically in FIGS. 2 and 3, to dissipate the heat produced by the electronic components mounted to the circuit boards an electrical fan 40 may be affixed to the rear plate 15 and positioned adjacent to an aperture in the plate (not shown) to permit substantially uniform distribution of air around each of the circuit boards 17. Such uniform distribution results naturally from the passage of air around the boards 17 since they are oriented to radiate away from the elongated structural member 20 thus providing elongated passages 42 between adjacent boards.

While but one embodiment of this invention has been herein illustrated, it will be appreciated by those skilled in the art that variations in the disclosed arrangement both as to details and as to the organization of such details may be made without departing from the spirit and scope thereof. Accordingly, it is intended that the foregoing disclosure and the showings made in the drawings will be considered only as illustrative of the principles of the invention and not construed in a limiting sense.

What is claimed is:

1. An assembly of circuit boards for electronic components comprising:

a pair of spaced substantially parallel plates having opposing surfaces;

a pair of coaxial support rings each rigidly affixed to a different one of opposing surfaces of said plates;

a cylindrical elongated structural member supported by said rings and defining therewith a central longitudinal axis of said assembly for electronically shielding a member positioned therein; and at least one pair of brackets each affixed to a different one of said rings at a substantially similar angular position on the periphery of said ring;

each of said brackets including securing means adapted to receive and secure one pair of edges of said circuit boards when the other pair of edges of said boards are positioned substantially parallel with said longitudinal axis.

2. The assembly of circuit boards for electronic components of claim 1 wherein the securing means includes a flange adapted to be secured to one of said rings and a plurality of fingers adapted to secure one edge of said circuit boards.

3. The assembly of circuit boards for electronic components of claim 1 including an electrical fan attached to one of said end plates with the blade thereof aligned to pass air into said assembly around said circuit boards in substantially even distribution.

References Cited by the Examiner

UNITED STATES PATENTS

| | | | |
|---|---|---|---|
| 2,892,131 | 6/1959 | MacDonnell | 317—101 |
| 2,958,013 | 10/1960 | Ansley | 317—101 |
| 2,960,754 | 11/1960 | Coda et al. | 317—101 X |
| 3,011,105 | 11/1961 | LeBlanc | 317—100 X |

ROBERT K. SCHAEFER, *Primary Examiner.*

M. GINSBURG, *Assistant Examiner.*